FREE-RUNNING GATE CONTROLLED SWITCH GENERATOR
WITH DISABLING SWITCH
Filed March 22, 1965
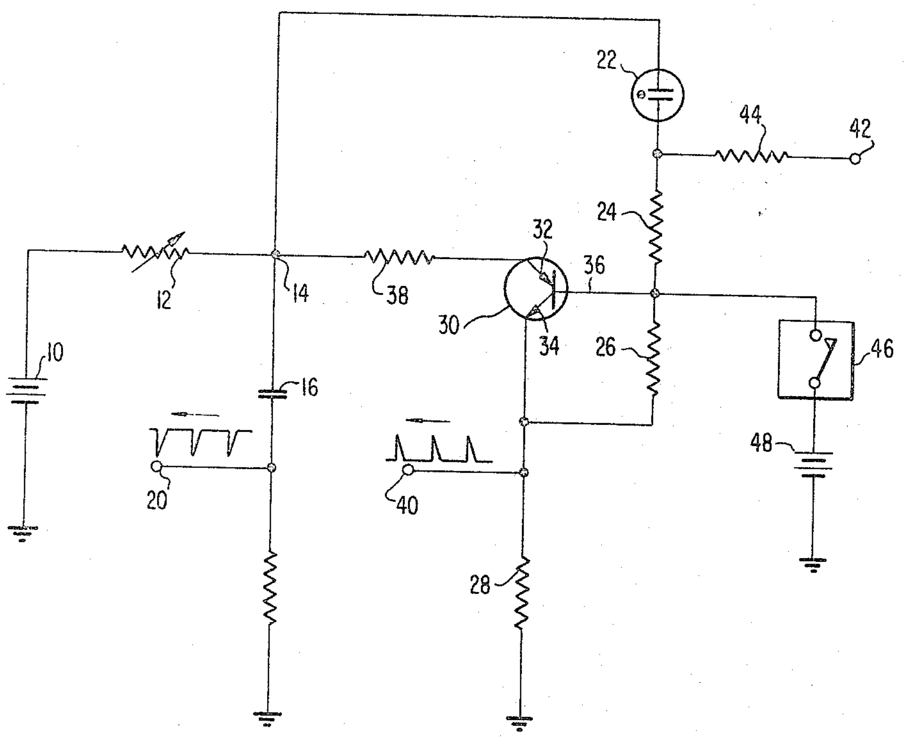
INVENTOR
S.C. REID
BY Sughrue, Rothwell, Mion,
Zinn & Macpeak
ATTORNEYS United States Patent Office 3,332,031

Patented July 18, 1967

3,332,031

FREE-RUNNING GATE CONTROLLED SWITCH GENERATOR WITH DISABLING SWITCH

Samuel Cameron Reid, St. Louis County, Mo., assignor to Monsanto Company, St. Louis, Mo., a corporation of Delaware Filed Mar. 22, 1965, Ser. No. 441,570

1 Claim. (Cl. 331—111)

ABSTRACT OF THE DISCLOSURE

A pulse generator circuit including a gate controlled semiconductor switch, a negative resistance breakdown device, a relaxation capacitor and an oscillator disabling means. The capacitor is charged from a voltage source to the breakdown voltage of the negative resistance breakdown device to produce a sudden surge of current which turns on the semiconductor switch and causes the capacitor to discharge therethrough. Opposite polarity output pulses are produced at output terminals connected to the capacitor and semiconductor switch, respectively. As the capacitor discharge current decreases, both the breakdown device and the semiconductor switch become non-conducting, and the capacitor will recharge to initiate another cycle. However, the cyclic action of the circuit may be disabled by applying to the gate of the semiconductor switch a potential which keeps the switch turned on even when the capacitor discharge current drops below the sustaining level necessary to maintain conduction in the switch. Consequently, the switch acts as a shunt across the capacitor and prevents the capacitor from recharging.

This invention relates broadly to oscillator circuits and more particularly to an improved semiconductor free-running pulse generator.

The primary object of this invention is to provide an improved free-running pulse generator which produces pulses having an extremely fast rise time.

Another object is to provide a free-running pulse generator whose output pulse repetition rate may be easily varied over a wide range from many kilo-hertz to many seconds.

A further object is to provide an improved free-running pulse generator of the relaxation type incorporating a silicon controlled switch for discharging the timing capacitor in the generator.

A more specific object is to provide a wide range free-running pulse generator of the relaxation type incorporating a voltage breakdown device responsive to the relaxation capacitor voltage periodically to apply firing potentials to the gate of a silicon controlled switch to discharge the capacitor and produce periodic output pulses having extremely fast rise times.

Another object is to provide such a pulse generator with disabling means which permits the generation of individual output pulses rather than a train of output pulses.

The foregoing objects are obtained in a preferred embodiment of this invention by providing a circuit wherein a capacitor is charged to a predetermined voltage through a variable resistor. Connected to one plate of the capacitor is one electrode of a neon gas tube and the anode of a silicon controlled switch. The gate of the controlled switch is coupled to the other electrode of the neon tube. When the capacitor charges to the predetermined voltage, the neon tube suddenly breaks down and conducts current which produces on the gate a voltage sufficiently high to turn on the silicon controlled switch and render it conducting. The capacitor then quickly discharges through the switch to produce an output pulse having a very fast rise time. As the capacitor discharges, its voltage falls below the value necessary to sustain conduction in the neon tube. The tube returns to its non-conducting state, thereby removing the potential from the gate of the controlled switch. Consequently, when the capacitor discharge current falls below the level necessary to sustain conduction through the silicon controlled switch, the switch turns off or becomes non-conducting. The capacitor then recharges to begin another timing cycle. The pulse repetition rate may be varied over a range of many kilohertz to many seconds.

Other objects and advantages of this invention will become apparent from the following description, claims and drawing which disclose the principle of the invention and a preferred mode of applying that principle.

The drawing is a schematic diagram of a preferred embodiment of this improved free-running pulse generator.

As shown in the drawing, a battery 10 is connected through a variable resistor 12 to a point 14. A capacitor 16 is connected in series with a resistor 18 between point 14 and ground. A negative output terminal 20 is connected to the junction between capacitor 16 and resistor 18.

Also connected to point 14 is one terminal of a neon gas tube 22 which is normally open circuited, but which will break down when its threshold or breakdown voltage is exceeded and present very low resistance to current flow. A voltage divider comprising the resistors 24 and 26 is connected between the other terminal of neon tube 22 and through a resistor 28 to ground.

Connected between the junction of resistors 26 and 28 and the point 14 is a four-layer PNPN latching device 30, also known as a silicon controlled switch, gate controlled switch or binistor. This switch comprises an anode 32, a cathode 34 and a gate 36. A current limiting resistor 38 is connected between the anode 32 and point 14.

A positive output terminal 40 is connected to the junction of cathode 34 and resistor 28. Another output terminal 42 is connected through a resistor 44 to the junction of neon tube 22 and resistor 24 to sample the firing voltage of the neon tube.

The circuit functions in the following manner. Battery 10 supplies charging current through variable resistor 12 to the capacitor 16 which acts as a relaxation timing capacitor. When capacitor 16 is charged to the threshold or breakdown voltage of neon tube 22, the tube 22 breaks down and provides a current path from battery 10 via tube 22 and resistors 24, 26, and 28 to ground. As current flows through the voltage divider 24, 26 there is developed at the junction of resistors 24 and 26 a voltage which is applied to the gate of silicon controlled switch 32. The circuit components are designed such that this voltage exceeds the firing potential of the controlled switch 32 thereby rendering the switch 32 suddenly conducting. Capacitor 16 then discharges quickly through resistor 38, the anode-cathode circuit of switch 32 and resistor 28 to ground to develop at output terminal 40 an output pulse having a very fast rise time. A complementary fast rise time negative pulse is developed at negative output terminal 20. The firing voltage of neon tube 22 appears at terminal 42.

As capacitor 16 discharges through control switch 32, the voltage at point 14 falls below the minimum voltage required to maintain neon tube 22 in a conducting state. Consequently, tube 22 returns to its non-conducting condition and removes the firing potential from gate 36 of switch 32, thereby permitting the switch to turn off or become non-conducting when the current flowing therethrough falls below the minimum value to sustain conduction.

Resistor 38 serves as a current limiting resistor and has a value such that the current supplied from battery 10 alone through switch 32 is insufficient to sustain conduction through the switch. Consequently, when the capacitor discharge current falls below a predetermined minimum value, the total current flowing through resistor 38 and controlled switch 32 is insufficient to maintain conduction through the switch, and consequently the switch is turned off or rendered non-conducting. When switch 32 becomes non-conducting, capacitor 16 once again is charged from source 10 through variable resistor 12 to repeat the cycle.

Resistor 12 and capacitor 16 form the time constant of the circuit and thereby determine the pulse repetition rate of the pulses appearing at terminals 20, 40 and 42. An increase in the value of resistor 12 increases the charging time required for capacitor 16 to charge to a voltage sufficient to fire tube 22, thereby reducing the pulse repetition rate. Similarly, if resistor 12 is lowered in value, the pulse repetition rate will be increased.

Neon tube 22 may be replaced by any open circuit stable negative resistance device such as an avalanche diode. The gate controlled switch 32 may also be an NPN and a PNP transistor connected to function in the same manner as a four-layer PNPN latching device.

This wide range pulse generator may be used as a short or long duty cycle pulse generator with reptition rates of many kilo-hertz to many seconds. The only limitation would be the surge current of the controlled switch 32 and the combined leakage currents of the capacitor 16, the controlled switch 32 and the open circuit and stable negative resistance device 22. This circuit has particular utility in a digital volt meter and in a display generator for a digital counter.

This free-running pulse generator may be converted to monostable or single shot operation. A positive potential applied directly to gate 36 will maintain switch 36 in a conducting state so that a constant D.C. voltage, rather than a series of pulses, appears at terminal 40. If the positive potential is then momentarily removed from the gate, the switch 32 will turn off. Capacitor 16 then charges to the voltage sufficient to breakdown tube 22, turn on switch 32, and discharge capacitor 16. If the positive potential is reapplied to the gate before switch 32 turns off, then the circuit is operating in a monostable mode.

One way of obtaining this monostable action is illustrated in the drawing. The positive potential is schematically represented by a battery 48. An electronic switch is schematically represented by a switch 46. Switch 46 is normally closed to apply positive potential to gate 36 and disable the circuit. Switch 46 is then momentarily opened sufficiently long to initiate one charging cycle of the capacitor 16 and then closed again before the next charging cycle is initiated.

While the invention has been particularly shown and described with reference to a preferred embodiment thereof, it will be understood by those skilled in the art that various changes in form and details may be made therein without departing from the spirit and scope of the invention.

What is claimed is:

A pulse generating circuit comprising:

(a) a gate controlled semiconductor switch having a gate electrode, an input electrode and an output electrode, (b) a first impedance connected to said input electrode, (c) means for continuously applying a first potential to said first impedance, (d) a capacitor having one end thereof coupled to said input electrode, (e) a second impedance connected between the other end of said capacitor and a reference potential, (f) a first output terminal connected to the junction of said capacitor and said second impedance, (g) a negative resistance breakdown device coupled between said one end of said capacitor and said gate electrode, (h) a third impedance connected between said gate electrode and said breakdown device, (i) a fourth impedance connected between said output electrode and said reference potential, (j) a second output terminal connected to the junction of said output electrode and said fourth impedance, and (k) switch means for connecting and disconnecting said gate electrode to and from a source of second potential, so that when said gate electrode is disconnected from said second potential, said capacitor charges to the breakdown voltage of said breakdown device to turn on said semiconductor switch and permit said capacitor to discharge therethrough to produce output pulses of opposite polarities on said first and second output terminals, said gate being connected to said second potential while the capacitor discharge current is still flowing through said semiconductor switch, thereby keeping said semiconductor switch turned on and preventing said capacitor from recharging until said gate is again disconnected from said second potential.

References Cited

UNITED STATES PATENTS

| | | | |
|---|---|---|---|
| 3,045,148 | 7/1962 | McNulty et al. | 331—111 |
| 3,189,759 | 6/1965 | Laishley | 307—88.5 |
| 3,215,950 | 11/1965 | Reiner | 331—111 |

FOREIGN PATENTS

| | | |
|---|---|---|
| 1,336,487 | 7/1963 | France. |

OTHER REFERENCES

Electronic Industries, pg. 116. September 1963.

ROY LAKE, *Primary Examiner.*

JOHN KOMINSKI, *Examiner.*